United States Patent
Lin et al.

(10) Patent No.: US 12,507,582 B2
(45) Date of Patent: Dec. 23, 2025

(54) PEROVSKITE DISPLAYS AND METHODS OF FORMATION

(71) Applicant: University of Washington, Seattle, WA (US)

(72) Inventors: Lih-Yuan Lin, Seattle, WA (US); Chen Zou, Seattle, WA (US); Ethan G. Keeler, Seattle, WA (US)

(73) Assignee: University of Washington, Seattle, WA (US)

( * ) Notice: Subject to any disclaimer, the term of this patent is extended or adjusted under 35 U.S.C. 154(b) by 558 days.

(21) Appl. No.: 17/915,819

(22) PCT Filed: Apr. 1, 2021

(86) PCT No.: PCT/US2021/025404
§ 371 (c)(1),
(2) Date: Sep. 29, 2022

(87) PCT Pub. No.: WO2021/202889
PCT Pub. Date: Oct. 7, 2021

(65) Prior Publication Data
US 2023/0157144 A1 May 18, 2023

Related U.S. Application Data

(60) Provisional application No. 63/108,617, filed on Nov. 2, 2020, provisional application No. 63/006,768, filed
(Continued)

(51) Int. Cl.
*H10K 71/20* (2023.01)
*H10K 59/35* (2023.01)
(Continued)

(52) U.S. Cl.
CPC .......... *H10K 71/211* (2023.02); *H10K 59/35* (2023.02); *H10K 71/15* (2023.02); *H10K 85/111* (2023.02); *H10K 85/50* (2023.02)

(58) Field of Classification Search
CPC . H10K 71/211; H10K 59/35; H01L 21/02197
(Continued)

(56) References Cited

U.S. PATENT DOCUMENTS 5,416,042 A * 5/1995 Beach .................... H10B 12/31
361/321.1
11,067,879 B2 7/2021 Choy et al.
(Continued)

FOREIGN PATENT DOCUMENTS

KR 101655648 B1 1/2015
WO 2016072810 A1 5/2016
(Continued)

OTHER PUBLICATIONS

The International Search Report (ISR) with Written Opinion for PCT/US2021/025404 dated Jul. 19, 2021, pp. 1-11.
(Continued)

*Primary Examiner* — Quoc D Hoang
(74) *Attorney, Agent, or Firm* — McDonnell Boehnen Hulbert & Berhoff LLP

(57) ABSTRACT

A method includes forming a barrier layer on a substrate, removing a portion of the barrier layer to yield a patterned barrier layer and an exposed portion of the substrate within a hole in the patterned barrier layer, forming a first portion of a perovskite on the patterned barrier layer and a second portion of the perovskite on the exposed portion of the substrate, and removing the patterned barrier layer, thereby removing the first portion of the perovskite.

19 Claims, 10 Drawing Sheets

Related U.S. Application Data on Apr. 8, 2020, provisional application No. 63/005,047, filed on Apr. 3, 2020.

(51) Int. Cl.
  *H10K 71/15* (2023.01)
  *H10K 85/10* (2023.01)
  *H10K 85/50* (2023.01)

(58) Field of Classification Search
  USPC .......................................................... 438/35
  See application file for complete search history.

(56) References Cited

U.S. PATENT DOCUMENTS

| | | |
|---|---|---|
| 11,121,289 B2 | 9/2021 | Martin et al. |
| 2010/0255344 A1 | 10/2010 | Kim et al. |
| 2016/0036007 A1 | 2/2016 | Facchetti |
| 2017/0057815 A1 | 3/2017 | Elian et al. |
| 2018/0351121 A1 | 12/2018 | Mei et al. |

FOREIGN PATENT DOCUMENTS

| | | |
|---|---|---|
| WO | 2016-124555 | 8/2016 |
| WO | 2021184256 A1 | 9/2021 |

OTHER PUBLICATIONS

Lin, Chun-Ho et al. 'Orthogonal lithography for halide perovskite optoelectronic nanodevices.' ACS Nano (2019) vol. 13, pp. 1168-1176.

Ortigoza-Diaz, Jessica et al. 'Techniques and considerations in the microfabrication of Parylene C microelectromechanical Systems.' Micromachines (2018) vol. 9, pp. 1-25.

Keum, Chang-Min et al. 'Quasi-surface emission in vertical organic lightemitting transistors with network electrode.' Optics Express (2014) vol. 22, pp. 1-7.

Lin CH, Zeng Q, Lafalce E, Yu S, Smith MJ, Yoon YJ, Chang Y, Jiang Y, Lin Z, Vardeny ZV, Tsukruk VV. "Large-Area Lasing and Multicolor Perovskite Quantum Dot Patterns." Adv. Opt. Mater. 6, (2018).

Harwell J, Burch J, Fikouras A, Gather MC, Di Falco A, Samuel IDW. "Patterning Multicolor Hybrid Perovskite Films via Top-Down Lithography." ACS Nano 13, 3823-3829 (2019).

DeFranco JA, Schmidt BS, Lipson M, Malliaras GG. "Photolithographic patterning of organic electronic materials." Org. Electron. 7, 22-28 (2006).

Sun D, Böhringer KF. "Photovoltaic module active self-cleaning surface using anisotropic ratchet conveyors fabricated with parylene-C stencil." J. Phys. Conf. 1052, 012014 (2018).

Zou C, Zheng J, Chang C, Majumdar A, Lin LY. "Nonvolatile Rewritable Photomemory Arrays Based on Reversible Phase-Change Perovskite for Optical Information Storage." Adv. Opt. Mater. 7, 1900558 (2019).

Zou C, Huang CY, Sanehira EM, Luther JM, Lin LY. "Highly stable cesium lead iodide perovskite quantum dot light-emitting diodes." Nanotechnology 28, 455201 (2017).

Slinker JD, DeFranco JA, Jaquith MJ, Silveira WR, Zhong Y-W, Moran-Mirabal JM, Craighead HG, Abruna HD, Marohn JA, Malliaras GG. "Direct measurement of the electric-field distribution in a light-emitting electrochemical cell." Nature materials, 894 (2007).

Keeler EG, Zoy C, Lin LY. "Optically accessible MEMS resonant mass sensor for biological applications." J MEMS, 4vol. 28, No. 3, pp. 94-503 (2019).

Ban M, Zou Y, Rivett JPH, Yang Y, Thomas TH, Tan Y, Song T, Gao X, Credgington D, Deschler F, Sirringhaus H, Sun B. "Solution-processed perovskite light emitting diodes with efficiency exceeding 15% through additive-controlled nanostructure tailoring." Nat. Commun., 3892 (2018).

Yang X, Zhang X, Deng J, Chu Z, Jiang Q, Meng J, Wang P, Zhang L, Yin Z, You J. "Efficient green light-emitting diodes based on quasi-two-dimensional composition and phase engineered perovskite with surface passivation." Nat. Commun. 9, 570 (2018).

Zou C, Liu Y, Ginger D, Lin LY. "Suppressing Efficiency Roll-Off at High Current Densities for Ultra-Bright Green Perovskite Light-Emitting Diodes." ACS Nano, Apr. 23, 2020.

Lu M, Zhang Y, Wang S, Guo J, Yu WW, Rogach AL. "Metal Halide Perovskite Light-Emitting Devices: Promising Technology for Next-Generation Displays." Adv. Funct. Mater. 2019, 29, 1902008.

Xing J, Zhao Y, Askerka M, Quan LN, Gong X, Zhao W, Zhao J, Tan H, Long G, Gao L, Yang Z, Voznyy O, Tang J, Lu ZH, Xiong Q, Sargent EH. "Color-Stable Highly Luminescent Sky-Blue Perovskite Light-Emitting Diodes." Nat. Commun. 2018, 9, 3541.

Li Z, Chen Z, Yang Y, Xue Q, Yip HL, Cao Y. "Modulation of Recombination Zone Position for Quasi-Two-Dimensional Blue Perovskite Light-Emitting Diodes with Efficiency Exceeding 5%." Nat. Commun. 2019, 10, 1027.

Shang Y, Li G, Liu W, Ning Z. "Quasi-2d Inorganic Cspbbr3 Perovskite for Efficient and Stable Light-Emitting Diodes." Adv. Funct. Mater. 2018, 28, 1801193.

Han B, Cai B, Shan Q, Song J, Li J, Zhang F, Chen J, Fang T, Ji Q, Xu X. "Stable, Efficient Red Perovskite Light-Emitting Diodes by (a, ?)-Cspbi3 Phase Engineering". Adv. Funct. Mater. 2018, 28, 1804285.

Shen Y, Cheng LP, Li YQ, Li W, Chen JD, Lee ST, Tang JX. "Perovskite Light-Emitting Diodes: High-Efficiency Perovskite Light-Emitting Diodes with Synergetic Outcoupling Enhancement." Adv. Mater. 2019, 31, 1970174.

Leyden MR, Terakawa S, Matsushima T, Ruan S, Goushi K, Auffray M, Sandanayaka ASD, Qin C, Bencheikh F, Adachi C. "Distributed Feedback Lasers and Light-Emitting Diodes Using 1-Naphthylmethylamnonium Low-Dimensional Perovskite." ACS Photonics 2019, 6, 460-466.

Fakharuddin A, Qiu W, Croes G, Devizis A, Gegevicius R, Vakhnin A, Rolin C, Genoe J, Gehlhaar R, Kadashchuk A, Gulbinas V, Heremans P. "Reduced Efficiency Roll-Off and Improved Stability of Mixed 2d/3d Perovskite Light Emitting Diodes by Balancing Charge Injection." Adv. Funct. Mater. 2019, 29, 1904101.

Murawski C, Leo K, Gather MC. "Efficiency Roll-Off in Organic Light-Emitting Diodes." Adv. Mater. 2013, 25, 6801-6827.

Shirasaki Y, Supran GJ, Tisdale WA, Bulovic V. "Origin of Efficiency Roll-Off in Colloidal Quantum-Dot Light-Emitting Diodes." Phys. Rev. Lett. 2013, 110, 217403.

Sun Y, Su Q, Zhang H, Wang F, Zhang S, Chen S. "Investigation on Thermally Induced Efficiency Roll-Off: Toward Efficient and Ultrabright Quantum-Dot Light-Emitting Diodes." ACS Nano 2019, 13, 11433-11442.

Zou, W, Li R, Zhang S, Liu Y, Wang N, Cao Y, Miao Y, Xu M, Guo Q, Di D, Zhang L, Yi C, Gao F, Friend RH, Wang J, Huang W. "Minimising Efficiency Roll-Off in High-Brightness Perovskite Light-Emitting Diodes." Nat. Commun. 2018, 9, 608.

Yang M, Wang N, Zhang S, Zou W, He Y, Wei Y, Xu M, Wang J, Huang W. "Reduced Efficiency Roll-Off and Enhanced Stability in Perovskite Light-Emitting Diodes with Multiple Quantum Wells." J Phys. Chem. Lett. 2018, 9, 2038-2042.

Sim K, Jun T, Bang J, Kamioka H, Kim J, Hiramatsu H, Hosono H. "Performance Boosting Strategy for Perovskite Light-Emitting Diodes." Appl. Phys. Rev. 2019, 6, 031402.

Shen H, Gao Q, Zhang Y, Lin Y, Lin Q, Li Z, Chen L, Zeng Z, Li X, Jia Y, Wang S, Du Z, Li LS, Zhang Z. "Visible Quantum Dot Light-Emitting Diodes with Simultaneous High Brightness and Efficiency." Nat. Photonics 2019, 13, 192-197.

Brenner P, Bar-On O, Jakoby M, Allegro I, Richards BS, Paetzold UW, Howard IA, Scheuer J, Lemmer U. "Continuous Wave Amplified Spontaneous Emission in Phase-Stable Lead Halide Perovskites." Nat. Commun. 2019, 10, 988.

Nakanotani H, Oyamada T, Kawamura Y, Sasabe H, Adachi C. "Injection and Transport of High Current Density over 1000 a/Cm2 in Organic Light Emitting Diodes under Pulse Excitation." Jpn. J Appl. Phys. 2005, 44, 3659-3662.

Setoguchi Y, Adachi C. "Suppression of Roll-Off Characteristics of Electroluminescence at High Current Densities in Organic Light

(56) References Cited

OTHER PUBLICATIONS

Emitting Diodes by Introducing Reduced Carrier Injection Barriers." J Appl. Phys. 2010, 108, 064516.

Giuri A, Yuan Z, Miao Y, Wang J, Gao F, Sestu N, Saba M, Bongiovanni G, Colella S, Esposito Corcione C, Gigli G, Listorti A, Rizzo A. "Ultra-Bright near-Infrared Perovskite Light-Emitting Diodes with Reduced Efficiency Roll-Off." Sci. Rep. 2018, 8, 15496.

Kim H, Zhao L, Price JS, Grede, AJ, Roh K, Brigeman AN, Lopez M, Rand BP, Giebink NC. "Hybrid Perovskite Light Emitting Diodes under Intense Electrical Excitation." Nat. Commun. 2018, 9, 4893.

Byun J, Cho H, Wolf C, Jang M, Sadhanala A, Friend RH, Yang H, Lee TW. "Efficient Visible Quasi-2d Perovskite Light-Emitting Diodes." Adv. Mater. 2016, 28, 7515-20.

Zou Y, Ban M, Yang Y, Bai S, Wu C, Han Y, Wu T, Tan Y, Huang Q, Gao X, Song T, Zhang Q, Sun B. "Boosting Perovskite Light-Emitting Diode Performance Via Tailoring Interfacial Contact." ACS Appl. Mater. Interfaces 2018, 10, 24320-24326.

Liu Y, Wu T, Liu Y, Song T, Sun B. "Suppression of Non-Radiative Recombination toward High Efficiency Perovskite Light-Emitting Diodes." APL Mater. 2019, 7, 021102.

Liu Y, Cui J, Du K, Tian H, He Z, Zhou Q, Yang Z, Deng Y, Chen D, Zuo X, Ren Y, Wang L, Zhu H, Zhao B, Di D, Wang J, Friend RH, Jin Y. "Efficient Blue Light-Emitting Diodes Based on Quantum-Confined Bromide Perovskite Nanostructures." Nat. Photonics 2019,13, 760-764.

Straus DB, Kagan CR. Electrons, Excitons, and Phonons in Two-Dimensional Hybrid Perovskites: Connecting Structural, Optical, and Electronic Properties. J Phys. Chem. Lett. 2018, 9, 1434-1447.

Kirkwood N, Singh B, Mulvaney P. "Enhancing Quantum Dot Led Efficiency by Tuning Electron Mobility in the Zno Electron Transport Layer." Adv. Mater. Interfaces 2016, 3, 1600868.

Straus DB, Iotov N, Gau MR, Zhao Q, Carroll PJ, Kagan CR. "Longer Cations Increase Energetic Disorder in Excitonic 2d Hybrid Perovskites." J Phys. Chem. Lett. 2019, 10, 1198-1205.

King G, Wu B, Wu X, Li M, Du B, Wei Q, Guo J, Yeow EK, Sum TC, Huang W. "Transcending the Slow Bimolecular Recombination in Lead-Halide Perovskites for Electroluminescence." Nat. Commun. 2017, 8, 14558.

Milot RL, Eperon GE, Green T, Snaith HJ, Johnston MB, Herz LM. "Radiative Monomolecular Recombination Boosts Amplified Spontaneous Emission in Hc(Nh2)2sni3 Perovskite Films." J Phys. Chem. Lett. 2016, 7, 4178-4184.

Richter JM, Abdi-Jalebi M, Sadhanala A, Tabachnyk M, Rivett JPH, Pazos-Outon LM, Godel KC, Price M, Deschler F, Friend RH. "Enhancing Photoluminescence Yields in Lead Halide Perovskites by Photon Recycling and Light out-Coupling." Nat. Commun. 2016, 7, 13941.

DeQuilettes DW, Koch S, Burke S, Paranji RK, Shropshire AJ, Ziffer ME, Ginger DS. "Photoluminescence Lifetimes Exceeding 8 Ms and Quantum Yields Exceeding 30%in Hybrid Perovskite Thin Films by Ligand Passivation." ACS Energy Lett. 2016, 1, 438-444.

Abdi-Jalebi, M, Andaji-Garmaroudi Z, Cacovich S, Stavrakas C, Philippe B, Richter JM, Alsari M, Booker EP, Hutter EM, Pearson AJ, Lilliu S, Savenije TJ, Rensmo H, Divitini G, Ducati C, Friend RH, Stranks SD. "Maximizing and Stabilizing Luminescence from Halide Perovskites with Potassium Passivation." Nature 2018, 555, 497-501.

Cho H, Kim YH, Wolf C, Lee HD, Lee TW. "Improving the Stability of Metal Halide Perovskite Materials and Light- Emitting Diodes." Adv. Mater. 2018, 30, 1704587.

Lee H, Ko D, Lee C. "Direct Evidence of Ion-Migration-Induced Degradation of Ultrabright Perovskite Light-Emitting Diodes." ACS Appl. Mater. Interfaces 2019, II, 11667-11673.

Chen Z, Li Z, Zhang C, Jiang XF, Chen D, Xue Q, Liu M, Su S, Yip HL, Cao Y. "Recombination Dynamics Study on Nanostructured Perovskite Light-Emitting Devices." Adv. Mater. 2018, 30, 1801370.

Li J, Yuan X, Jing P, Li J, Wei M, Hua J, Zhao J, Tian L. "Temperature-Dependent Photoluminescence of Inorganic Perovskite Nanocrystal Films." RSC Adv. 2016, 6, 78311-78316.

Koh T-W, Spechler JA, Lee KM, Arnold CB, Rand BP. "Enhanced Outcoupling in Organic Light-Emitting Diodes Via a High-Index Contrast Scattering Layer." ACS Photonics 2015, 2, 1366-1372.

Lim J, Park YS, Klimov VI. "Optical Gain in Colloidal Quantum Dots Achieved with Direct-Current Electrical Pumping." Nat. Mater. 2018, 17, 42-49.

Matsushima T, Sasabe H, Adachi C. "Carrier Injection and Transport Characteristics of Copper Phthalocyanine Thin Films under Low to Extremely High Current Densities." Appl. Phys. Lett 2006,88,033508.

Naulleau, P. Optical Lithography, in Comprehensive Nanoscience and Nanotechnology, 2d Ed., 2019. Abstract downloaded at https://www.sciencedirect.com/topics/engineering/optical-lithography.

Xu, M.; Peng, Q.; Zou, W.; Gu, L.; Xu, L.; Cheng, L.; He, Y.; Yang, M.; Wang, N.; Huang, W.; Wang, J. A Transient- Electroluminescence Study on Perovskite Light-Emitting Diodes. Appl. Phys. Lett. 2019, 115, 041102.

Hayashi K, Nakanotani H, Inoue M, Yoshida K, Mikhnenko O, Nguyen T-Q, Adachi C. "Suppression of Roll-Off Characteristics of Organic Light-Emitting Diodes by Narrowing Current Injection/Transport Area to 50 Nm." Appl. Phys. Lett. 2015, 106, 093301.

Kuwae H, Nitta A, Yoshida K, Kasahara T, Matsushima T, Inoue M, Shoji S, Mizuno J, Adachi C. "Suppression of External Quantum Efficiency Roll-Off of Nanopatterened Organic-Light Emitting Diodes at High Current Densities." J. Appl. Phys. 2015, 118, 155501.

Abbas S., Algarni S., Shokouhi B.B., Abbas A.S., Yavuz M. , Cui B., "Metal and organic nanostructure fabrication by electron beam lithography and dry liftoff." 14th IEEE International Conference on Nanotechnology, 2014, pp. 392-395, doi: 10.1109/NANO.2014.6968083.

Chang C., Zou C., Odendahl M., Lin LY. "Towards Perovskite LED Displays." 2020 IEEE Photonics Conference (IPC), 2020, pp. 1-2, doi: 10.1109/IPC47351.2020.9252363.

Jiang, Y. "Surface and Interface Engineering in Quantum Dot and Double-Heterojunction Nanorod Light-Emitting Diodes." Dissertation submitted for Doctor of Philosophy in Materials Science & Engineering, University of Illinois at Urbana-Champaign, 2018.

Chang C, Zou C, Odendahl M, Lin L. "A Dry Lift-off Method for Patterning Perovskites," in Conference on Lasers and Electro-Optics, OSA Technical Digest (Optica Publishing Group, 2020), paper SF3F.7.

Zou C, Chang C, Sun D, Bohringer KF, Lin LY, "Photolithographic Patterning of Perovskite Thin Films for Multicolor Display Applications." Nano. Lett. 2020, 20, 3710-3717.

Han X, Wu W, Chen H, Peng D, Qiu L, Yan P, Pan C. "Metal Halide Perovskite Arrays: From Construction to Optoelectronic Applications." Adv. Funct. Mater. 2020, 2005230. https://doi.org/10.1002/advm.202005230.

Chang, JH-C, Kang, Tai DY-C, "Dry mechanical liftoff technology for metallization on parylene-C using SU-8," 2012 7th EEE International Conference on Nano/Micro Engineered and Molecular Systems (NEMS), 2012, pp. 286-289, doi: 10.1109/NEMS.2012.6196776.

Kim Y-C, Cho H, Heo JH, Kim T-S, Myoung NS, Lee C-L, Im SH, L T-W, "Multicolored Organic/Inorganic Perovskite Light-Emitting Diodes." Adv. Mater. 2015, 27, 1248-1254.

Yu JC, Kim DB, Jung ED, Lee, BR, Song, MH, "High-performance perovskite light-emitting diodes via morphological control of perovskite films", Nanoscale 2016, vol. 8, No. 13, pp. 7036-7042.

Li J, Shan X, Bade SGR, Geske T, Jiang Q, Yang X, Yu Z, "Single-Layer Halide Perovskite Light-Emitting Diodes with Sub-Band Gap Turn-On Voltage and High Brightness," J. Phys. Chem. Lett., 2016, vol. 7, No. 20, pp. 4059-4066.

University of Washington Clean Energy Institute, "Perovskite Solar Cell." Downloaded from https://www.cei.washington.edu/education/science-of-solar/perovskite-solar-cell/.

Service RF, "Perovskite LEDs Begin to Shine." Science, vol. 364, p. 918, Jun. 7, 2019.

(56) References Cited

OTHER PUBLICATIONS

Kilner JA. "Perovskites", ScienceDirect 2018. Downloaded from https://www.sciencedirect.com/topics/earth-and-planetary-sciences/perovskites.
Wang N, Cheng L, Ge R, Zhang S, Miao Y, Zou W, Yi C, Sun Y, Cao Y, Yang R, Wei Y, Guo Q , Ke Y, Yu M, Jin Y, Liu Y, Ding Q, Di D, Yang L, Xing G, Tian H, Jin C, Gao F, Friend RH, Wang J, Huang W. "Perovskite Light-Emitting Diodes Based on Solution-Processed Self-Organized Multiple Quantum Wells." Nature Photonics, 2016, 10, 699-70.
Zou C, Chang C, Sun DS, Bohringer KF, Lin LY, "Photolithographic Patterning of Perovskite Thin Films for Multicolor Displays." Nano Lett., 2020, 20, 3710-3717.
Cerelli RA, . . . Nalamasu O. "Optical Lithography," Encyclopedia of Materials: Science and Technology, ScienceDirect, 2011. Downloaded from https://www.sciencedirect.com/topics/materials-science/optical-lithography.
Wafer World, "Photolithography-Its Importance in Semiconductor Manufacturing." Downloaded at https://www.waferworld.com/post/photolithography-its-importance-in-semiconductor-manufacturing.
Georgia State University, Department of Physics and Astronomy. "LED Device Structure." Downloaded at http://hyperphysics.phy-astr.gsu.edu/hbase/Electronic/leds.html.
BCC Research, "Photonic Crystals: Materials, Technologies and Global Markets." Downloaded at https://www.pccresearch.com/market-research/advanced-materials/photonic-crystals.html.
Kim T-H, Cho K-S, Lee EK, Lee SJ, Chae J, Kim Jw, Kim Dh, Kwon J-Y, Amaratunga G, Lee SY, Choi BL, Kuk Y, Kim JM, Kim K, "Full-colour quantum dot displays fabricated by transfer printing." Nat. Photonics 5, 176-182 (2011).
Dai X, Deng Y, Peng X, Jin Y, "Quantum-Dot Light-Emitting Diodes for Large-Area Displays: Towards the Dawn of Commercialization." Adv. Mater. 29, (2017).
Wu W, Wang X, Han X, Yang Z, Gao G, Zhang Y, Hu J, Tan Y, Pan A, Pan C, "Flexible Photodetector Arrays Based on Patterned CH3 NH3 PbI3- x Clx Perovskite Film for Real-Time Photosensing and Imaging." Adv. Mater. 31, e1805913 (2019).
Prins F. Kim DK, Cui J, De Leo E, Spiegel LL, McPeak KM, Norris DJ. "Direct Patterning of Colloidal Quantum-Dot Thin Films for Enhanced and Spectrally Selective Out-Coupling of Emission." Nano Lett. 17, 1319-1325 (2017).
Lee EK, Park CH, Lee J, Lee HR, Yang C, Oh JH. "Chemically Robust Ambipolar Organic Transistor Array Directly Patterned by Photolithography." Adv. Mater. 29, (2017).
Park J-S, Kyhm J, Kim HH, Jeong S, Kang JH, Lee SE, Lee KT, Park K, Barange N, Han JY, Song JD. Alternative patterning process for realization of large-area, full-color, active quantum dot display. Nano Lett. 16, 6946-6953 (2016).
Lin S, Tan G, Yu J, Chen E, Weng Y, Zhou X, Xu S, Ye Y, Yan QF, Guo T. "Multi-primary-color quantum-dot down-converting films for display applications." Opt. Express 27, 28480-28493 (2019).
Swarnkar A, Marshall AR, Sanehira EM, Chernomordik BD, Moore DT, Christians JA, Chakrabarti T, Luther JM. "Quantum dot-induced phase stabilization of alpha-CsPbI3 perovskite for high-efficiency photovoltaics." Science 354, 92-95 (2016).
Zhao B, Bai S, Kim V, Lamboll R, Shivanna R, Auras F, Richter JM, Yang L, Dai L, Alsari M, She X-J, Liang L, Zhang J, Lilliu S., Gao P, Snaith HJ, Wang J, Greenham NC, Friend RH, Di D. "High-efficiency perovskite-polymer bulk heterostructure light-emitting diodes." Nat. Photonics 12, 783-789 (2018).
In Q, Armin A, Burn PL, Meredith P. "Filterless narrowband visible photodetectors." Nat. Photonics 9, 687-694 (2015).
Jia Y, Kemer RA, Grede AJ, Rand BP, Giebink NC. "Continuous-wave lasing in an organic-inorganic lead halide perovskite semi-conductor." Nat. Photonics 11, 784-788 (2017).
Huang C-Y, Zou C, Mao C, Corp KL, Yao Y-C, Lee YJ, Schlenker CW, Jen AKY, Lin LY. "CsPbBr3 Perovskite Quantum Dot Vertical Cavity Lasers with Low Threshold and High Stability." ACS Photonics 4, 2281-2289 (2017).

Braly IL, deQuilettes DW, Pazos-Outon LM, Burke S, Ziffer ME, Ginger DS, Hillhouse HW. "Hybrid perovskite films approaching the radiative limit with over 90% photoluminescence quantum efficiency." Nat. Photonics 12, 355-361 (2018).
Lin K, Xing J, Quan LN, Garcia de Arquer FP, Gong X, Lu J, Xie L, Zhao W, Zhang D, Yan C, Li W, Liu X, Lu Y, Kirman J, Sargent EH, Xiong Q, Wei Z. "Perovskite light-emitting diodes with external quantum efficiency exceeding 20 per cent." Nature 562, 245-248 (2018).
Wang Q, Wang X, Yang Z, Zhou N, Deng Y, Zhao J, Xiao X, Rudd P, Moran A, Yan Y, Huang J. "Efficient sky-blue perovskite light-emitting diodes via photoluminescence enhancement." Nat. Commun. 10, 5633 (2019).
Cao Y, Wang N, Tian H, Guo J, We Y, Chen H, Miao Y, Zou W, Pan K, He Y, Cao H, Ke Y, Xu M, Wang Y, Yang M, Du K, Fu Z, Kong D, Dai D, Jin Y, Li G, Li H, Peng Q, Wang J, Huang W. "Perovskite light-emitting diodes based on spontaneously formed submicrometre-scale structures." Nature 562, 249-253 (2018).
Chiba T, Hayashi Y, Ebe H, Hoshi K, Sato J, Sato S, Pu YJ, Ohisa S, Kido J. "Anion-exchange red perovskite quantum dots with ammonium iodine salts for highly efficient light-emitting devices." Nat. Photonics 12, 681-687 (2018).
Xu W, Hu Q, Bai S, Bao C, Miao Y, Yuan Z, Borzda T, Barker AJ, Tyukalova E, Hu Z, Kawecki M, Wang H, Yan Z, Liu K, Shi X, Uvdal K, Fahlman M, Zhang W, Duchamp M, Liu J-M, Petrozza A, Wang J, Liu L-M. "Rational molecular passivation for high-performance perovskite light-emitting diodes." Nat. Photonics 13, 418-424 (2019).
Yang X, Wu J, Liu T, Zhu R. "Patterned Perovskites for Optoelectronic Applications." Small Methods 2, (2018).
Lyashenko D, Perez A, Zakhidov A. "High-resolution patterning of organohalide lead perovskite pixels for photodetectors using orthogonal photolithography." Phys. Status Solidi A 214, (2017).
Liu Y, Li F, Qiu L, Yang K, Li Q, Zheng X, Hu H, Guo T, Wu C, Kim TW. "Fluorescent Microarrays of in Situ Crystallized Perovskite Nanocomposites Fabricated for Patterned Applications by Using Inkjet Printing." ACS Nano 13, 2042-2049 (2019).
Wong Y-C, Wu W-B, Want T, Ng JDA, Khoo KH, Wu J, Tan Z-K. "Color Patterning of Luminescent Perovskites via Light-Mediated Halide Exchange with Haloalkanes." Adv. Mater. 31, e1901247 (2019).
Shi L, Meng L, Jiang F, Ge Y, Li F, Wu X-G, Zhong H. "In Situ Inkjet Printing Strategy for Fabricating Perovskite Quantum Dot Patterns." Adv. Funct. Mater. 29, (2019).
Gu Z, Wang K, Li H, Gao M, Li L, Kuang M, Zhao YS, Li M, Song Y. "Direct-Writing Multifunctional Perovskite Single Crystal Arrays by Inkjet Printing." Small 13, (2017).
Wang H, Haroldson R, Balachandran B, Zakhidov A, Sohal S, Chan HY, Zakhidov A, Hu W. "Nanoimprinted Perovskite Nanograting Photodetector with Improved Efficiency." ACS Nano 10, 10921-10928 (2016).
Pourdavoud N, Wang S, Mayer A, Hu T, Chen Y, Marianovich A, Kowalsky W, Heiderhoff R, Scheer H-C, Reidl T. "Photonic Nanostructures Patterned by Thermal Nanoimprint Directly into Organo-Metal Halide Perovskites." Adv. Mater. 29, (2017).
Mao J, Sha Wei, Zh.ang H, Ren X, Zhuang J, Roy VAL, Wong KS, Choy WCH. "Novel Direct Nanopatterning Approach to Fabricate Periodically Nanostructured Perovskite for Optoelectronic Applications." Adv. Funct. Mater. 27, (2017).
Brittman S, Oener SZ, Guo K, Aboli H, Koenderink AF, Garnett EC. "Controlling crystallization to imprint nanophotonic structures into halide perovskites using soft lithography." J. Mater. Chem. C 5, 8301-8307 (2017).
Liu P, He X, Ren J, Liao Q, Yao J, Fu H. "Organic-Inorganic Hybrid Perovskite Nanowire Laser Arrays." ACS Nano 11, 5766-5773 (2017).
Kamminga ME, Fang H-H, Loi MA, ten Brink GH, Blake GR, Palstra TTM, ten Elshof JE. "Micropatterned 2D Hybrid Perovskite Thin Films with Enhanced Photoluminescence Lifetimes." ACS Appl. Mater. Interfaces 10, 12878-12885 (2018).

(56) References Cited

OTHER PUBLICATIONS

Lee W, Lee J, Yun H, Kim J, Park J, Choi C, Kim DC, Seo H, Lee H, Yu JW, Lee WB. "High-Resolution Spin-on-Patterning of Perovskite Thin Films for a Multiplexed Image Sensor Array." Adv. Mater. 29, (2017).

* cited by examiner

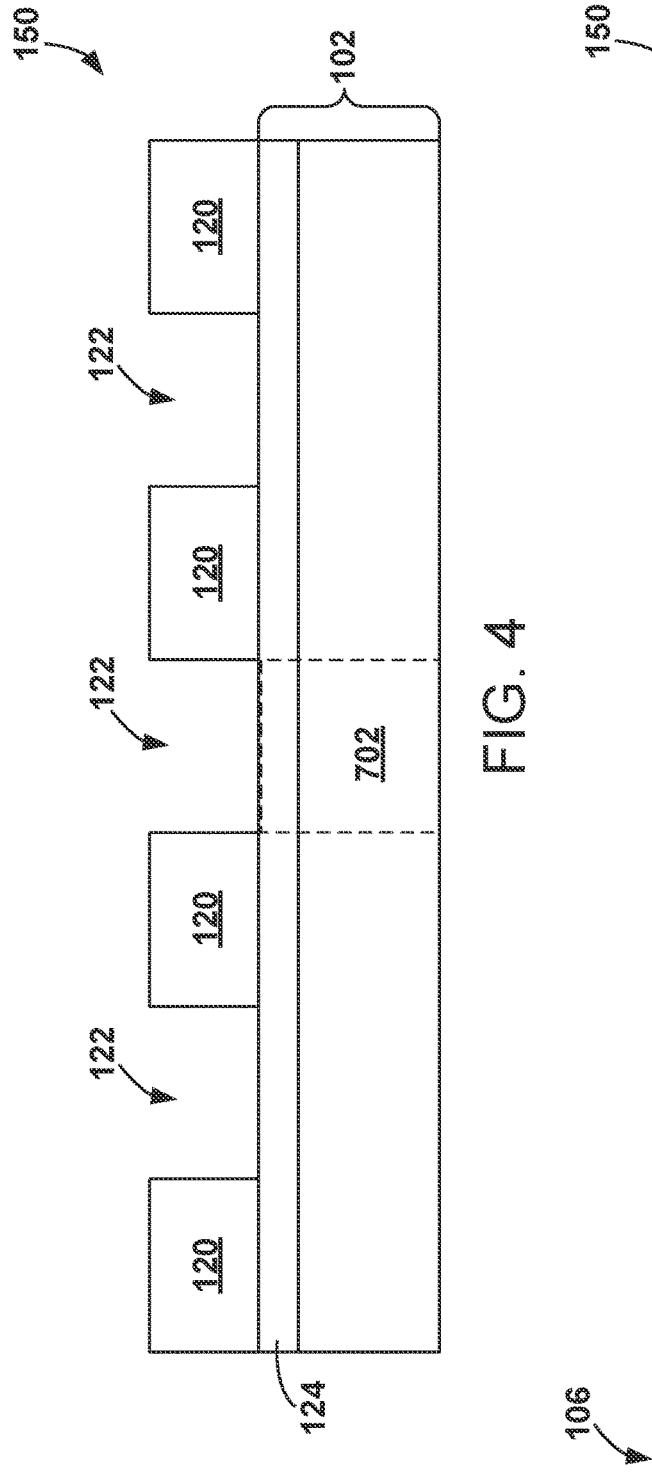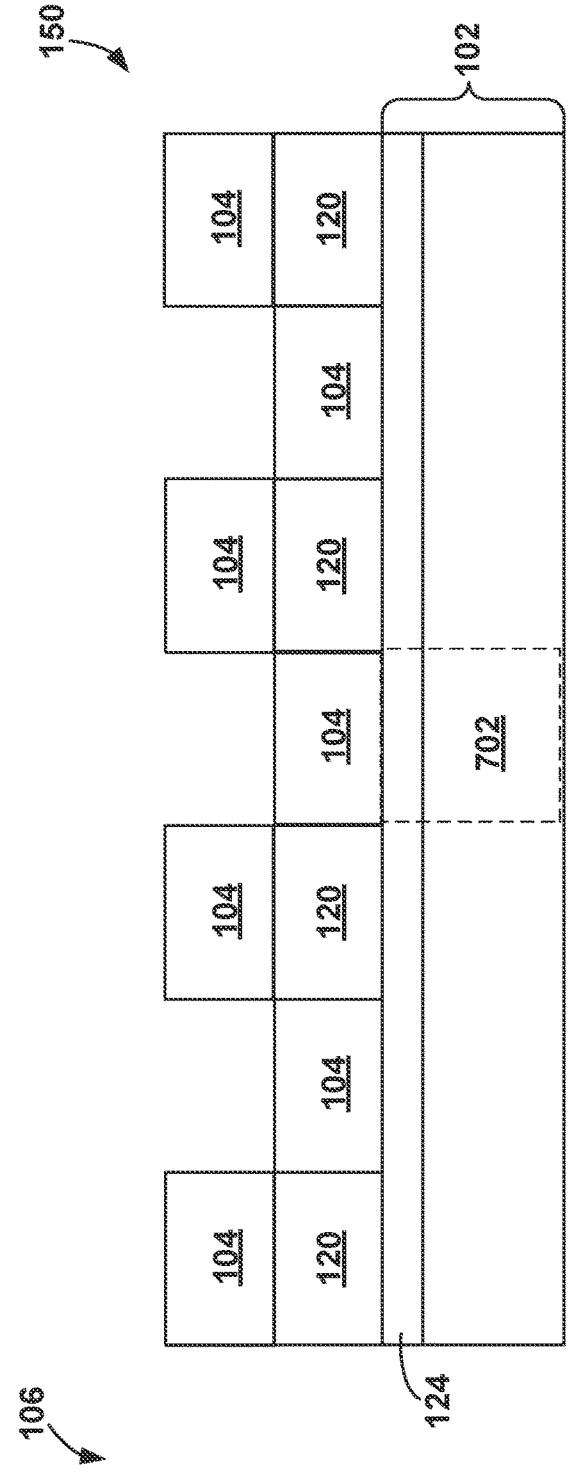
FIG. 4
FIG. 5

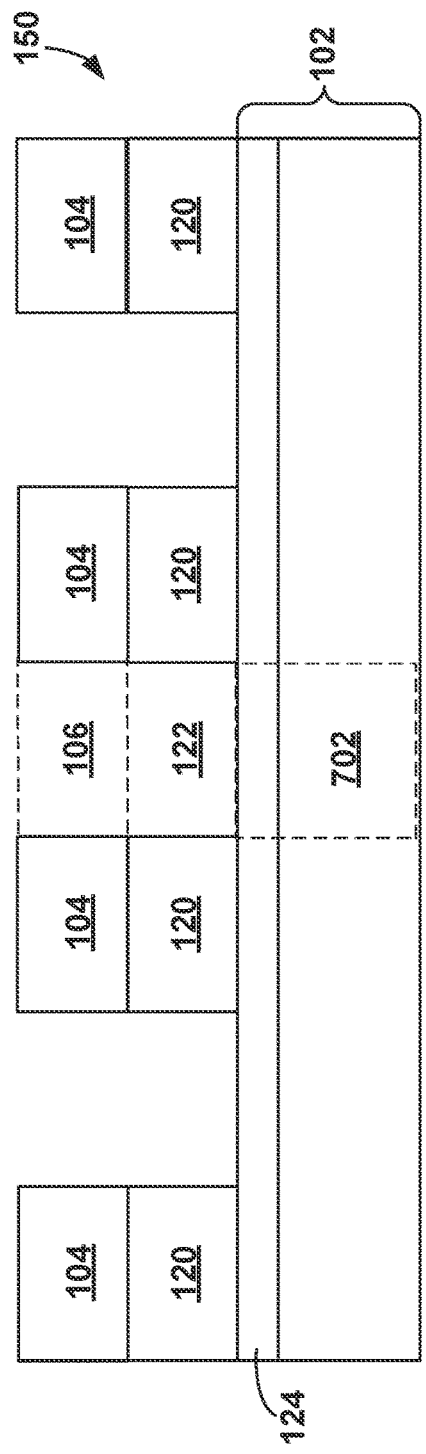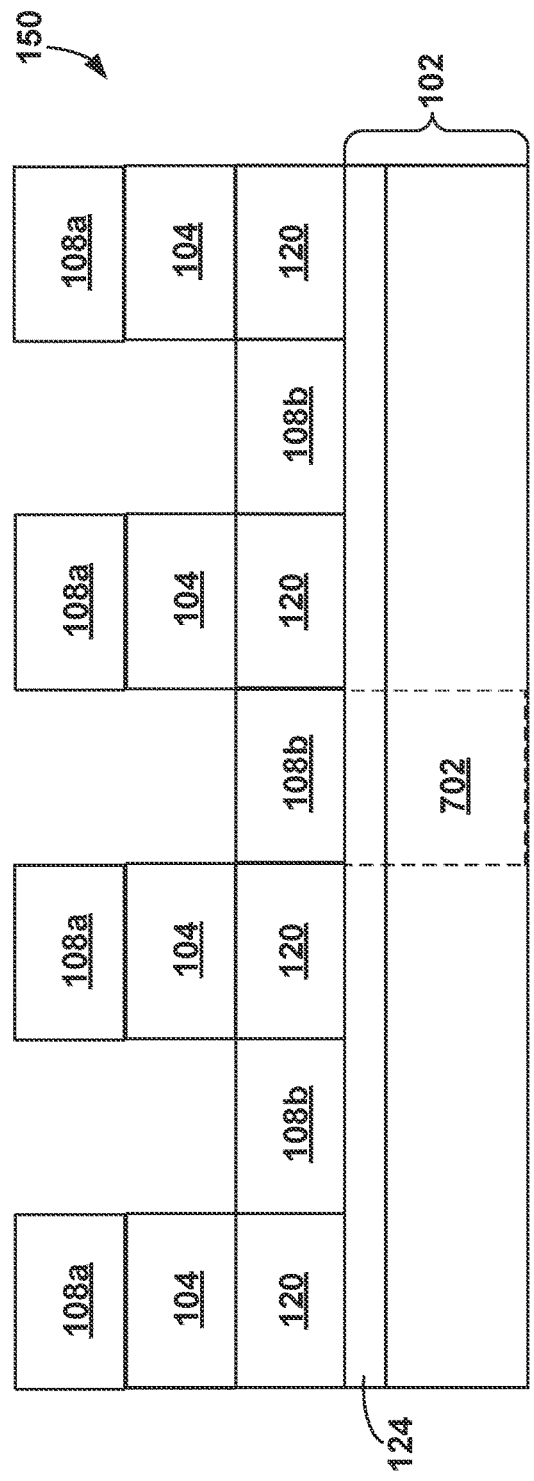

```
┌─────────────────────────────────────────────────────────┐
│  FORMING THE ELECTRICALLY INSULATING LAYER ON THE       │
│ SUBSTRATE SUCH THAT THE ELECTRICALLY INSULATING LAYER   │
│    FORMS THE APERTURE THAT EXPOSES THE SUBSTRATE        │
└─────────────────────────────────────────────────────────┘
     502
                            │
                            ▼
┌─────────────────────────────────────────────────────────┐
│   FORMING THE ONE OR MORE FUNCTIONAL LAYERS ON THE      │
│ ELECTRICALLY INSULATING LAYER AND WITHIN THE APERTURE   │
│                    ON THE SUBSTRATE                     │
└─────────────────────────────────────────────────────────┘
     504
                            │
                            ▼
┌─────────────────────────────────────────────────────────┐
│     FORMING THE ELECTRODE LAYER ON THE ONE OR MORE      │
│                    FUNCTIONAL LAYERS                    │
└─────────────────────────────────────────────────────────┘
     506
```

PEROVSKITE DISPLAYS AND METHODS OF FORMATION

CROSS-REFERENCE TO RELATED APPLICATION

This application is a § 371 national phase of international application no. PCT/US2021/025404, filed on Apr. 1, 2021, which claims priority to U.S. Provisional Patent Application No. 63/005,047, filed on Apr. 3, 2020, U.S. Provisional Patent Application No. 63/006,768, filed on Apr. 8, 2020, and U.S. Provisional Patent Application No. 63/108,617, filed on Nov. 2, 2020, the entire contents of all of which are incorporated herein by reference.

Also incorporated by reference herein is "Photolithographic Patterning of Perovskite Thin Films for Multicolor Display Applications," Chen Zou, Cheng Chang, Di Sun, Karl F. Bohringer, and Lih Y. Lin, Nano Letters 2020 20 (5), 3710-3717, DOI: 10.1021/acs.nanolett.0c00701.

Also incorporated by reference herein is "Suppressing Efficiency Roll-Off at High Current Densities for Ultra-Bright Green Perovskite Light-Emitting Diodes," Chen Zou, Yun Liu, David S. Ginger, and Lih Y. Lin, ACS Nano 2020 14 (5), 6076-6086, DOI: 10.1021/acsnano.0c01817

Also incorporated by reference herein is "C. Chang, C. Zou, M. Odendahl, and L. Y Lin, "A Dry Lift-off Method for Patterning Perovskites," in Conference on Lasers and Electro-Optics, OSA Technical Digest (Optical Society of America, 2020), paper SF3F.7.

FEDERAL FUNDING STATEMENT

This invention was made with government support under Grant No. ECCS1807397, awarded by the National Science Foundation. The government has certain rights in the invention.

BACKGROUND

Metal halide perovskites are emerging as attractive materials for various display applications, such as light-emitting diode (LED) displays and photoluminescent display technologies. These display applications typically involve the patterning of various material layers of a device structure. However, several lithographic methods widely used for patterning other materials have notable drawbacks when applied to perovskite materials.

SUMMARY

In a first aspect of the disclosure, a method comprises: forming a barrier layer on a substrate; removing a portion of the barrier layer to yield a patterned barrier layer and an exposed portion of the substrate within a hole in the patterned barrier layer; forming a first portion of a perovskite on the patterned barrier layer and a second portion of the perovskite on the exposed portion of the substrate; and removing the patterned barrier layer, thereby removing the first portion of the perovskite.

In a second aspect of the disclosure, a semiconductor structure comprises an array of perovskite islands on a substrate, the array of perovskite islands having a pitch of 10 μm or less.

In a third aspect of the disclosure, an intermediate structure for formation of a semiconductor structure comprises: a substrate; and a patterned layer of poly(p-xylylene) on the substrate, the patterned layer exposing a portion of the substrate.

In a fourth aspect of the disclosure, a semiconductor structure comprises: a substrate; an electrically insulating layer on the substrate, the electrically insulating layer forming an aperture; one or more functional layers on the electrically insulating layer and within the aperture; and an electrode layer on the one or more functional layers.

In a fifth aspect of the disclosure, a method of forming a semiconductor structure comprises: forming the electrically insulating layer on the substrate such that the electrically insulating layer forms the aperture that exposes the substrate; forming the one or more functional layers on the electrically insulating layer and within the aperture on the substrate; and forming the electrode layer on the one or more functional layers.

When the term "substantially" or "about" is used herein, it is meant that the recited characteristic, parameter, or value need not be achieved exactly, but that deviations or variations, including, for example, tolerances, measurement error, measurement accuracy limitations, and other factors known to those of skill in the art may occur in amounts that do not preclude the effect the characteristic was intended to provide. In some examples disclosed herein, "substantially" or "about" means within +/−0-5% of the recited value.

These, as well as other aspects, advantages, and alternatives will become apparent to those of ordinary skill in the art by reading the following detailed description, with reference where appropriate to the accompanying drawings. Further, it should be understood that this summary and other descriptions and figures provided herein are intended to illustrate the invention by way of example only and, as such, that numerous variations are possible.

BRIEF DESCRIPTION OF THE DRAWINGS

FIG. 4 is a schematic cross section of an intermediate structure, according to an example embodiment.

FIG. 5 is a schematic cross section of an intermediate structure, according to an example embodiment.

FIG. 6 is a schematic cross section of an intermediate structure, according to an example embodiment.

FIG. 7 is a schematic cross section of an intermediate structure, according to an example embodiment.

FIG. 13 is a block diagram of a method, according to an example embodiment.

DETAILED DESCRIPTION

As noted above, more reliable methods for patterning and processing perovskite materials to produce display devices are needed. Examples of such methods and devices are discussed in the present disclosure.

Figure 1:
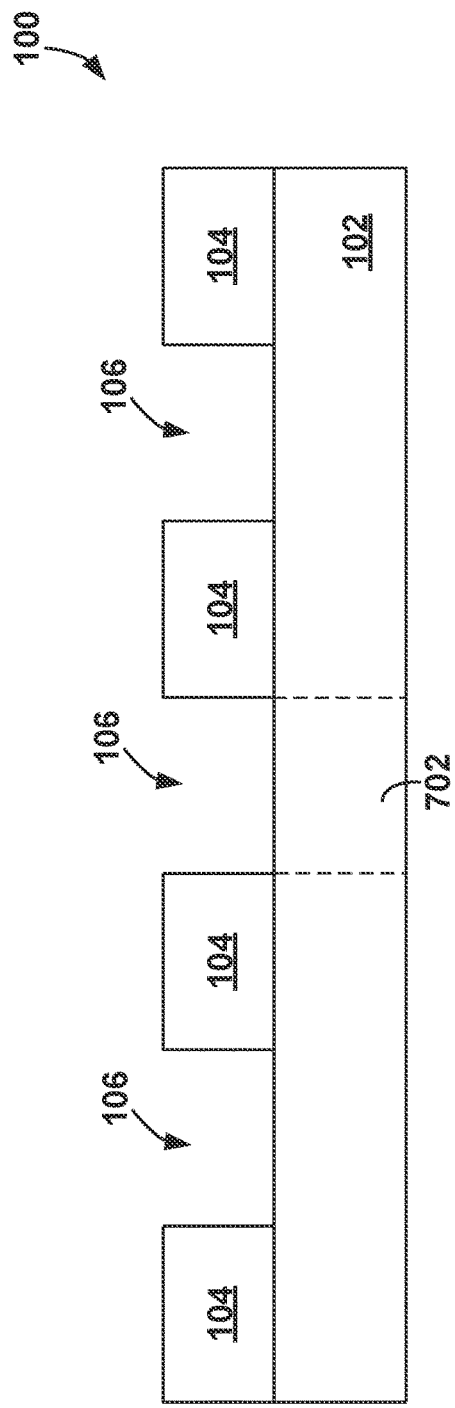
FIG. 1 is a schematic cross section of an intermediate structure, according to an example embodiment.

FIG. 1 is a schematic cross section of an intermediate structure 100. The intermediate structure 100 can be used to form a semiconductor structure 200 shown in FIG. 2. The intermediate structure 100 includes a substrate 102 and a patterned layer of poly(p-xylylene) 104 on the substrate 102. The patterned layer of poly(p-xylylene) 104 exposes a portion 702 of the substrate 102.

The substrate 102 can be formed of glass, silicon, polyester (PET), polyimide (PI), polyethylene naphthalate (PEN), polyetherimide (PEI), or sapphire.

The poly(p-xylylene) 104 can include one or more of Parylene™ C, Parylene™ Parylene™ FIT, Parylene™ AF-4, or Parylene™ F.

Figure 2:
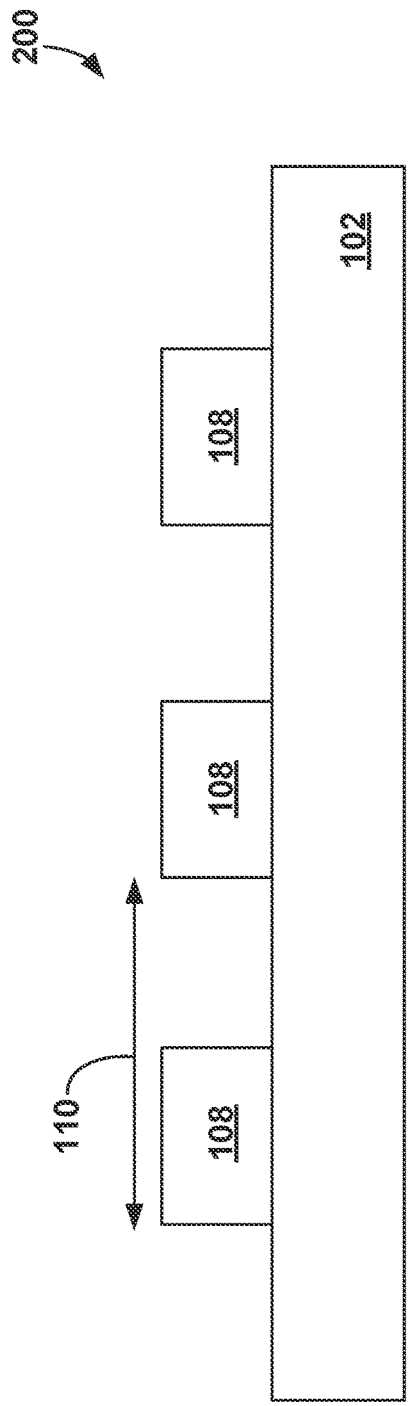
FIG. 2 is a schematic cross section of a semiconductor structure, according to an example embodiment.

FIG. 2 is a schematic cross section of the semiconductor structure 200. The semiconductor structure 200 includes an array of perovskite islands 108 on the substrate 102. The array of perovskite 108 islands have a pitch 110 of 10 μm or less. The process described below can yield structures with this pitch. The perovskite islands 108 can absorb light and remit light in a different color. For example, the perovskite islands 108 can absorb blue light and remit green or red light.

The semiconductor structure 200 can be part of a display including a virtual reality display, an extended reality display, an augmented reality display, an energy efficient display, a full color display, a multi-color display, a full spectrum display, a high-definition display, a light emitting diode (LED) display, an organic light emitting diode (OLED) display, a monochrome display, and/or a liquid crystal display (LCD).

Figure 3:
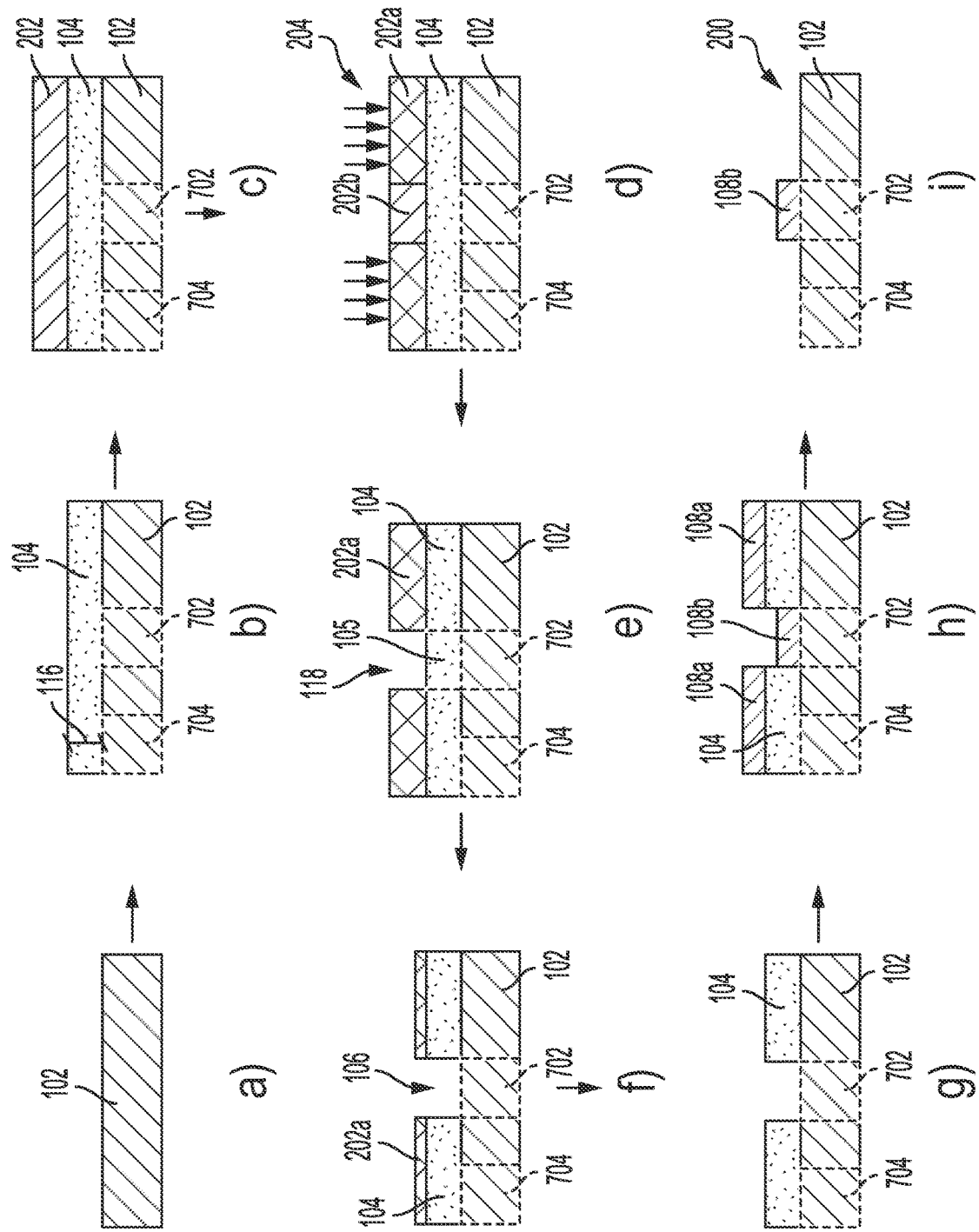
FIG. 3 is a schematic diagram of a method for forming a semiconductor structure, according to an example embodiment.

FIG. 3 is a schematic depiction of a method for forming the semiconductor structure 200.

Panel a) shows the substrate 102. Referring to panel b), chemical vapor deposition (CVD) is used to deposit a barrier layer 104 (e.g., of poly(p-xylylene)) on the substrate 102 at an ambient temperature of 18° C. to 23° C. The barrier layer 104 has a thickness of 1 μm to 5 μm. As shown, the barrier layer 104 covers a portion 702 of the substrate 102 and a portion 704 of the substrate 102. In some examples, the portion 702 and the portion 704 are pixels (e.g., a light emitting diodes) of a display. More specifically, the portion 702 and the portion 704 are pixels that emit blue light.

In panel c), a photoresist layer 202 is formed (e.g., via spin coating) on the barrier layer 104. In panel d), a mask (not shown) is used to cover a portion 202b of the photoresist layer 202 while a portion 202a of the photoresist layer 202 is exposed to light 204. In panel e), the photoresist layer 202 is developed and the portion 202b is removed to form a hole 118 within the photoresist layer 202. In this example, negative photoresist is used, but positive photoresist can instead be used.

In panel f), the barrier layer 104 is etched (e.g., via reactive ion etching or acetone immersion) at the bottom of the hole 118 to form the hole 106 in the barrier layer 104. In panel g), the photoresist layer 202 is stripped away. In panel h), a first portion 108a of a perovskite is formed on the barrier layer 104 and a second portion 108b is formed on the exposed portion 702 of the substrate 102. For example, the first portion 108a and the second portion 108b of the perovskite 108 can be formed via spin coating.

More specifically, one can dispense a solution of one or more of $C_8H_{12}BrN$ (PEABr), CsBr, or $PbBr_2$ dissolved within dimethyl sulfoxide on the barrier layer 104 and on the exposed portion 702 of the substrate 102 and spin the substrate 102 such that the solution is spread across the barrier layer 104 and on the exposed portion 702 of the substrate 102.

Additionally or alternatively, one can dispense a solution of one or more of $C_8H_{12}ClN$ (PEACl), CsCl, $PbCl_2$, $C_8H_{12}IN$ (PEAI), CsI, or $PbI_2$ dissolved within dimethyl sulfoxide on the barrier layer 104 and on the exposed portion 702 of the substrate 102 and spin the substrate 102 such that the solution is spread across the barrier layer 104 and on the exposed portion 702 of the substrate 102.

Generally, the perovskite 108 includes one or more metal halides with a formula $ABX_3$, with A being a monovalent cation including one or more of Cs, methylammonium, or formamidinium, B being a metal including Pb or Sn, and X being a halide including Cl, Br, or I. The perovskite 108 is cured and solidified by annealing the perovskite 108 at an ambient temperature within a range of 90° C. to 110° C.

In panel i), the barrier layer 104 is removed, thereby concurrently removing the first portion 108a of the perovskite. For example, the barrier layer 104 can be immersed in a solvent such as acetone, dissolved, and rinsed away from the substrate 102. In another example, the barrier layer 104 can be removed manually and/or via mechanical means (e.g., tweezers).

This process leaves the second portion 108b of the perovskite on the substrate 102, forming the semiconductor structure 200. As one of skill in the art can appreciate, the barrier layer 104 can be patterned using the aforementioned process to expose many portions (e.g., pixels) on the substrate 102 to be covered with the perovskite 108.

FIG. 4 is a schematic cross section of an intermediate structure 150. In some examples, an insulating layer 120 can be formed and patterned on the substrate 102 prior to forming the barrier layer 104 on the substrate 102. The insulating layer 120 forms a second hole 122 that exposes the portion 702 of the substrate 102. In this example, the insulating layer 120 is formed on an electrode layer 124 of the substrate 102.

As shown in FIG. 5, the barrier layer 104 is then formed on the insulating layer 120 and within the hole(s) 122 of the insulating layer 120. In FIG. 6, the portions of the barrier layer 104 within the holes 122 are etched or otherwise removed. The hole(s) 106 in the barrier layer are aligned with the hole(s) 122 in the insulating layer 120.

In FIG. 7, the first portion 108a and the second portion 108b of the perovskite 108 are formed on the barrier layer 104 that remains and on the exposed portions 702 of the substrate 102, respectively. A hole transport layer and an electron transport layer (not shown) can also be deposited to form an LED with the second portion 108b of the perovskite 108.

Figure 8:
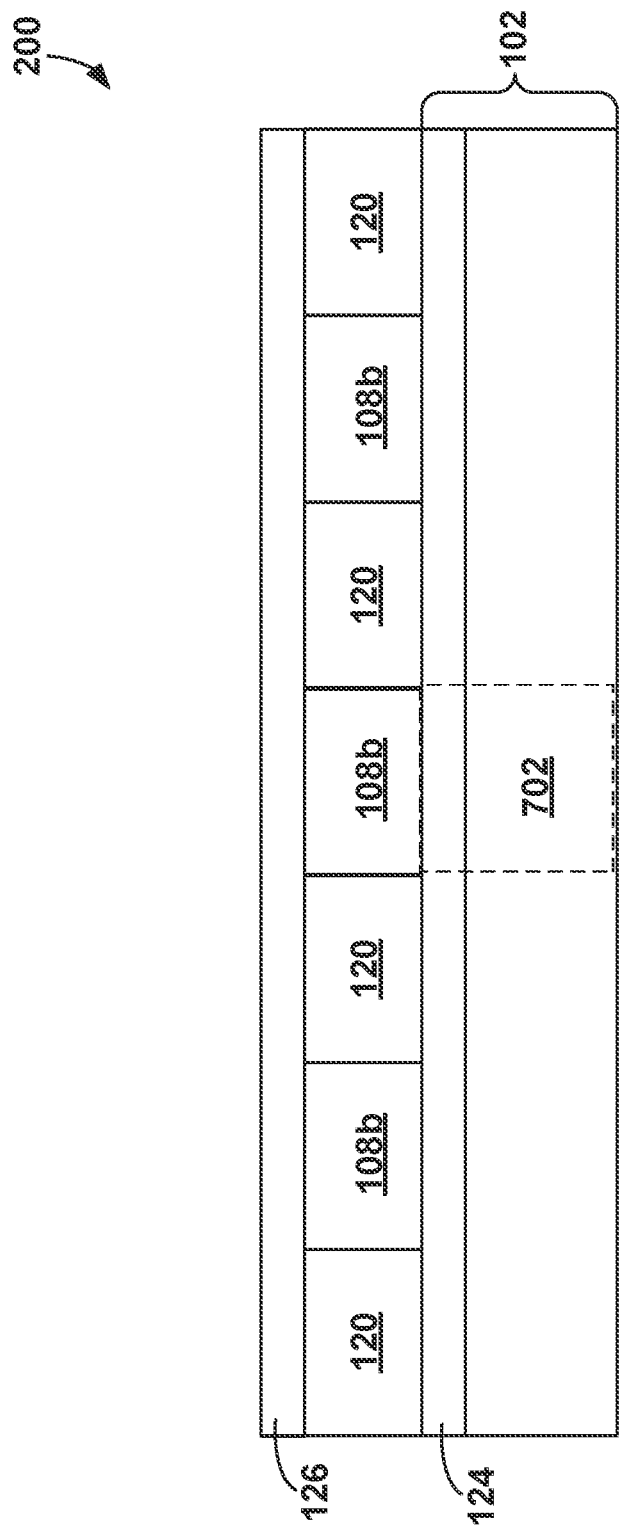
FIG. 8 is a schematic cross section of a semiconductor structure, according to an example embodiment.

In FIG. 8, the barrier layer 104 is removed as described above, and an additional electrode layer 126 is deposited on the insulating layer 120 and the second portion 108b of the perovskite 108. The electrode layer 126 can be patterned so that pixels can be individually addressed.

Figure 9:
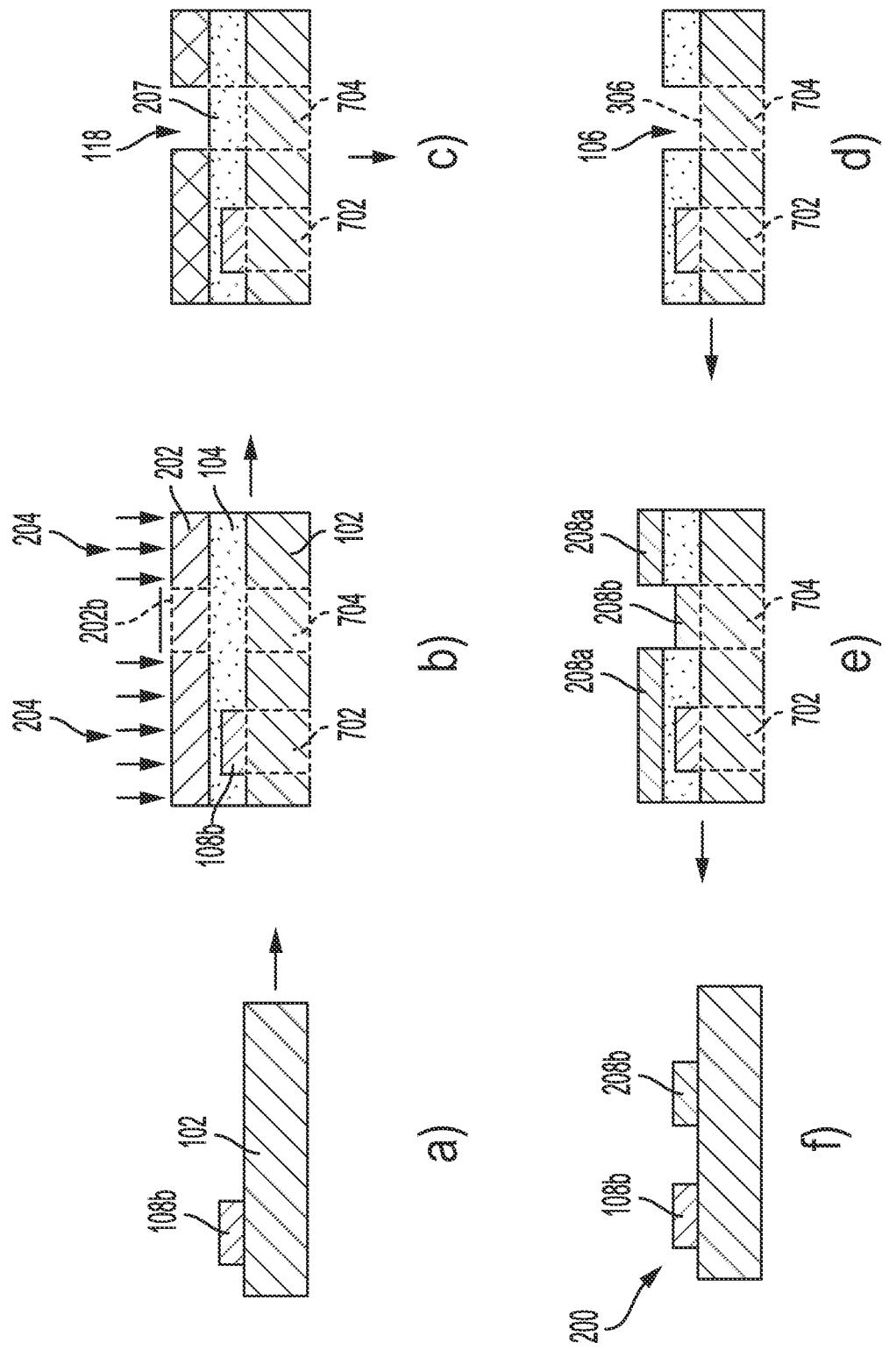
FIG. 9 is a schematic diagram of a method for forming a semiconductor structure, according to an example embodiment.

FIG. 9 is a schematic depiction of a method for forming additional perovskite materials (e.g., having a different color) on the substrate 102. In this example, the portions 108a and 108b of the perovskite 108 are configured to emit first light via photoluminescence, the first light having a first spectral power distribution (e.g., green).

In panel a), the portion(s) 108b of the perovskite 108 are already on the substrate 102. In panel b), another barrier layer 104 is formed on the portion 108b of the perovskite 108 and on the substrate 102. Also, a photoresist layer 202 is formed (e.g., via spin coating) on the barrier layer 104. A mask is used to cover a portion 202b of the photoresist layer 202 while another portion 202a of the photoresist layer 202 is exposed to light 204. In panel c), the photoresist layer 202 is developed and the portion 202b is removed to form a hole 118 within the photoresist layer 202. In this example, negative photoresist is used, but positive photoresist can instead be used.

In panel d), a portion 207 of the barrier layer 104 is etched or otherwise removed from the substrate 102. This exposes the portion 704 of the substrate within the hole 106 in the barrier layer 104. In panel e), a first portion 208a of a second perovskite 208 is formed on the barrier layer 104 and a second portion 208b of the perovskite 208 is formed on the portion 704 of the substrate. In this context, the second perovskite 208 is configured to emit second light via photoluminescence, the second light having a second spectral power distribution (e.g., red). In panel f), the barrier layer 104 is removed, as described above, thereby removing the first portion 208a of the perovskite 208.

This process leaves the second portion 208b of the perovskite 208 on the substrate 102 with the second portion 108b of the perovskite 108, forming the semiconductor structure 200. As one of skill in the art can appreciate, the barrier layer 104 can be patterned using the aforementioned process to expose many portions (e.g., pixels) on the substrate 102 to be covered with the perovskite 208. In this way, pixels of the substrate 102 can be covered with numerous green or red perovskite materials to emit green or red light, whereas uncovered pixels of the substrate 102 can emit blue light.

Figure 10:
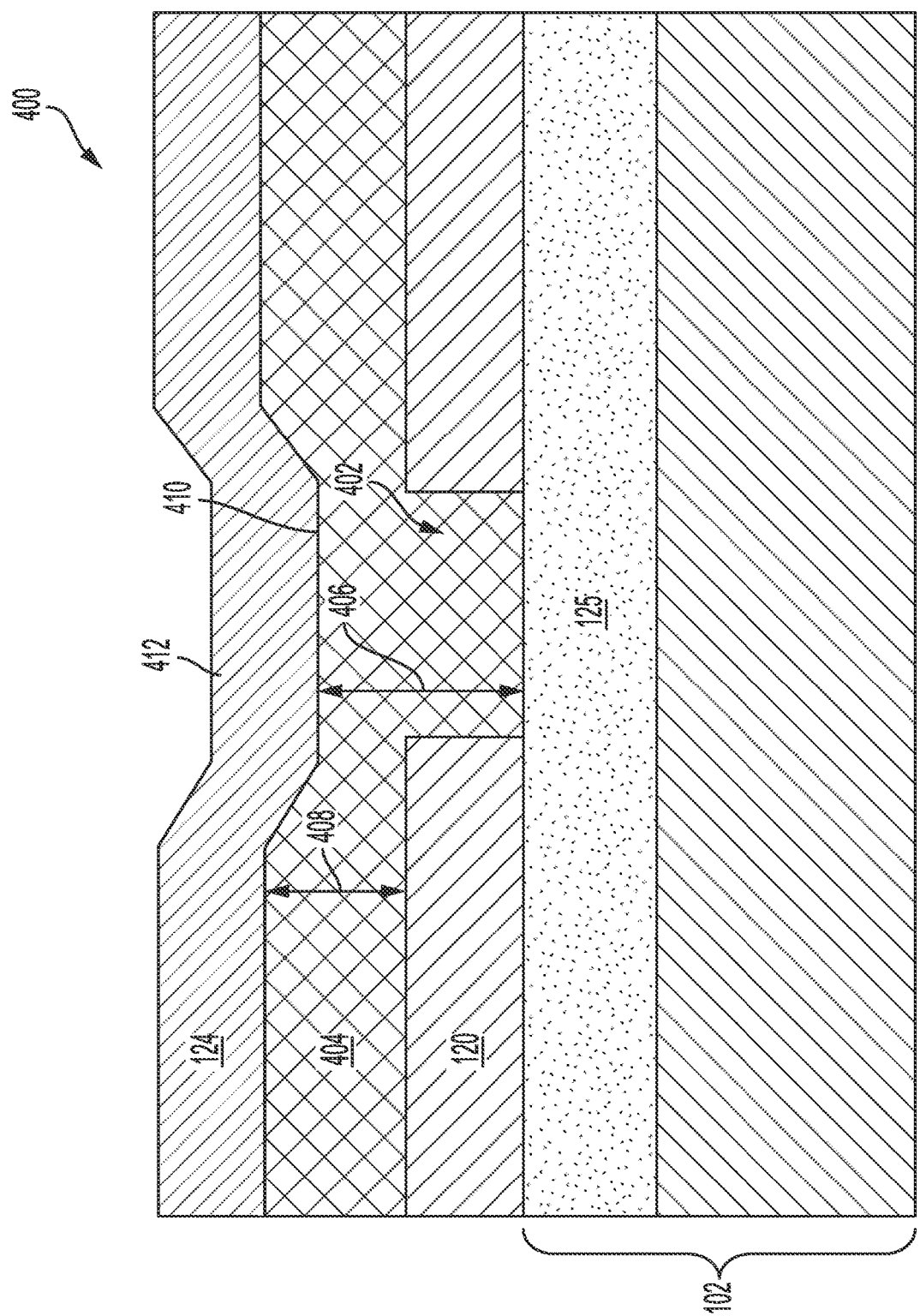
FIG. 10 is a schematic cross section of a semiconductor structure, according to an example embodiment.

FIG. 10 is a schematic cross section of a semiconductor structure 400. The semiconductor structure 400 includes the substrate 102 (e.g., glass) and the electrically insulating layer 120 (e.g., silicon dioxide) on the substrate 102. The electrically insulating layer 120 forms an aperture 402. The semiconductor structure 400 also includes one or more functional layers 404 on the electrically insulating layer 120 and within the aperture 402, and an electrode layer 124 (e.g, aluminum and/or lithium fluoride) on the one or more functional layers 404.

The substrate 102 is substantially transparent to visible light. The substrate 102 includes an electrically conductive layer 125 in contact with the electrically insulating layer 120. The electrically conductive layer 125 (e.g., indium tin oxide (ITO)) is substantially transparent to visible light.

In some examples, the one or more functional layers 404 are the active layers of a light emitting diode (LED). A first thickness 406 of the one or more functional layers 404 aligned with the aperture 402 can be greater than a second thickness 408 of the one or more functional layers 404 over the electrically insulating layer 120. The one or more functional layers 404 can form a surface 410 that is indented toward the electrically insulating layer 120 over the aperture 402. The one or more functional layers 404 are in contact with the electrically conductive layer 125. The one or more functional layers 404 include one or more of a hole transport layer, a perovskite material that includes KBr, or 2,2',2''-(1, 3,5-Benzinetriyl)-tris(1-phenyl-1-H-benzimidazole) (TPBi).

The electrode layer 124 forms a surface 412 that can be indented toward the electrically insulating layer 120 over the aperture 402. The semiconductor structure 400 can be part of a virtual reality, extended reality, or augmented reality display system.

In an example, the electrically insulating layer 120 is formed on the substrate 102 (e.g., on the electrically conductive layer 125) such that the electrically insulating layer 120 forms the aperture 402 that exposes the substrate 102. That is, the electrically insulating layer 120 can be deposited and patterned using methods described above.

Next, the one or more functional layers 404 are formed (e.g., via spin coating or CVD) on the electrically insulating layer 120 and within the aperture 402 on the substrate 102. The electrode layer 124 is also formed on the one or more functional layers 404 (e.g., via sputtering).

Figure 11:
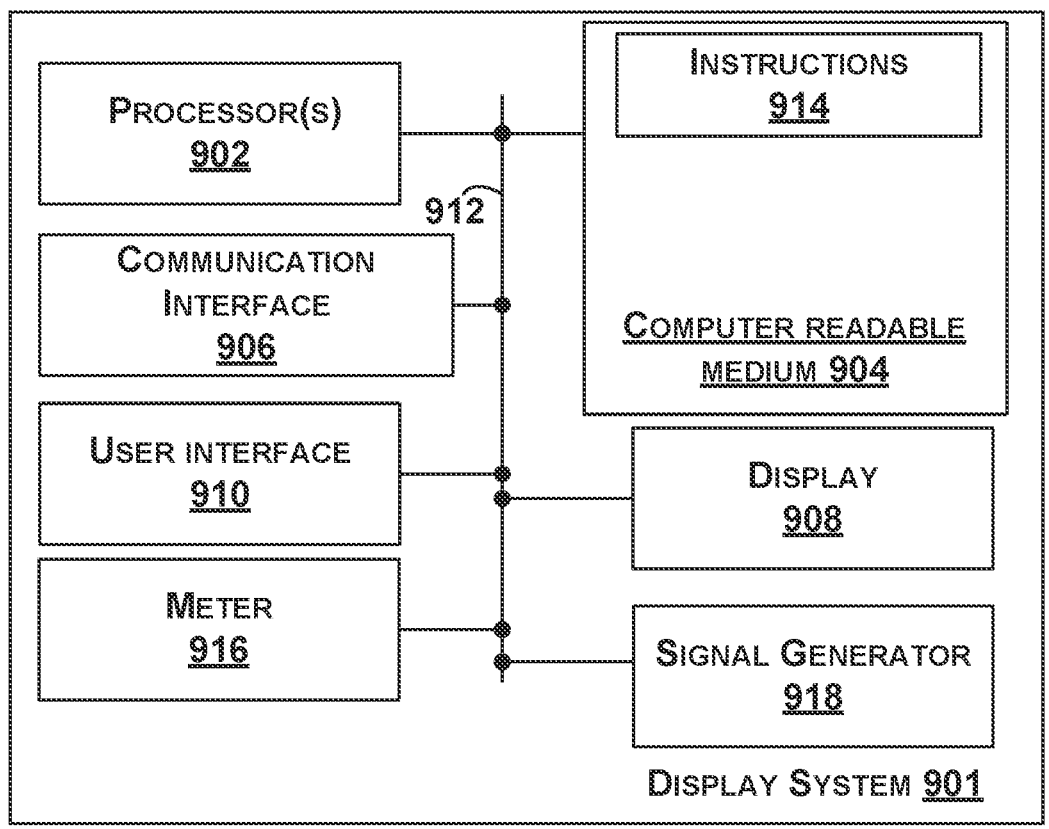
FIG. 11 is a block diagram of a display system, according to an example embodiment.

FIG. 11 is a schematic diagram of a display system 901. The display system 901 includes one or more processors 902, a non-transitory computer readable medium 904, a communication interface 906, a display 908, and a user interface 910. Components of the display system 901 are linked together by a system bus, network, or other connection mechanism 912.

The one or more processors 902 can be any type of processor(s), such as a microprocessor, a digital signal processor, a multicore processor, etc., coupled to the non-transitory computer readable medium 904.

The non-transitory computer readable medium 904 can be any type of memory, such as volatile memory like random access memory (RAM), dynamic random access memory (DRAM), static random access memory (SRAM), or non-volatile memory like read-only memory (ROM), flash memory, magnetic or optical disks, or compact-disc read-only memory (CD-ROM), among other devices used to store data or programs on a temporary or permanent basis.

Additionally, the non-transitory computer readable medium 904 can be configured to store instructions 914. The instructions 914 are executable by the one or more processors 902 to cause the display system 901 to perform any of the functions or methods described herein.

The communication interface 906 can include hardware to enable communication within the display system 901 and/or between the display system 901 and one or more other devices. The hardware can include transmitters, receivers, and antennas, for example. The communication interface 906 can be configured to facilitate communication with one or more other devices, in accordance with one or more wired or wireless communication protocols. For example, the communication interface 906 can be configured to facilitate wireless data communication for the display system 901 according to one or more wireless communication standards, such as one or more Institute of Electrical and Electronics Engineers (IEEE) 801.11 standards, ZigBee standards, Bluetooth standards, etc. As another example, the communication interface 906 can be configured to facilitate wired data communication with one or more other devices.

The display 908 can be any type of display component configured to display data. As one example, the display 908 can include a touchscreen display. As another example, the display 908 can include a flat-panel display, such as a liquid-crystal display (LCD) or a light-emitting diode (LED) display. Additionally or alternatively, the display 908 includes a virtual reality display, an extended reality display, and/or an augmented reality display.

The user interface 910 can include one or more pieces of hardware used to provide data and control signals to the display system 901. For instance, the user interface 910 can include a mouse or a pointing device, a keyboard or a keypad, a microphone, a touchpad, or a touchscreen, among other possible types of user input devices. Generally, the user interface 910 can enable an operator to interact with a graphical user interface (GUI) provided by the display system 901 (e.g., displayed by the display 908).

Figure 12:
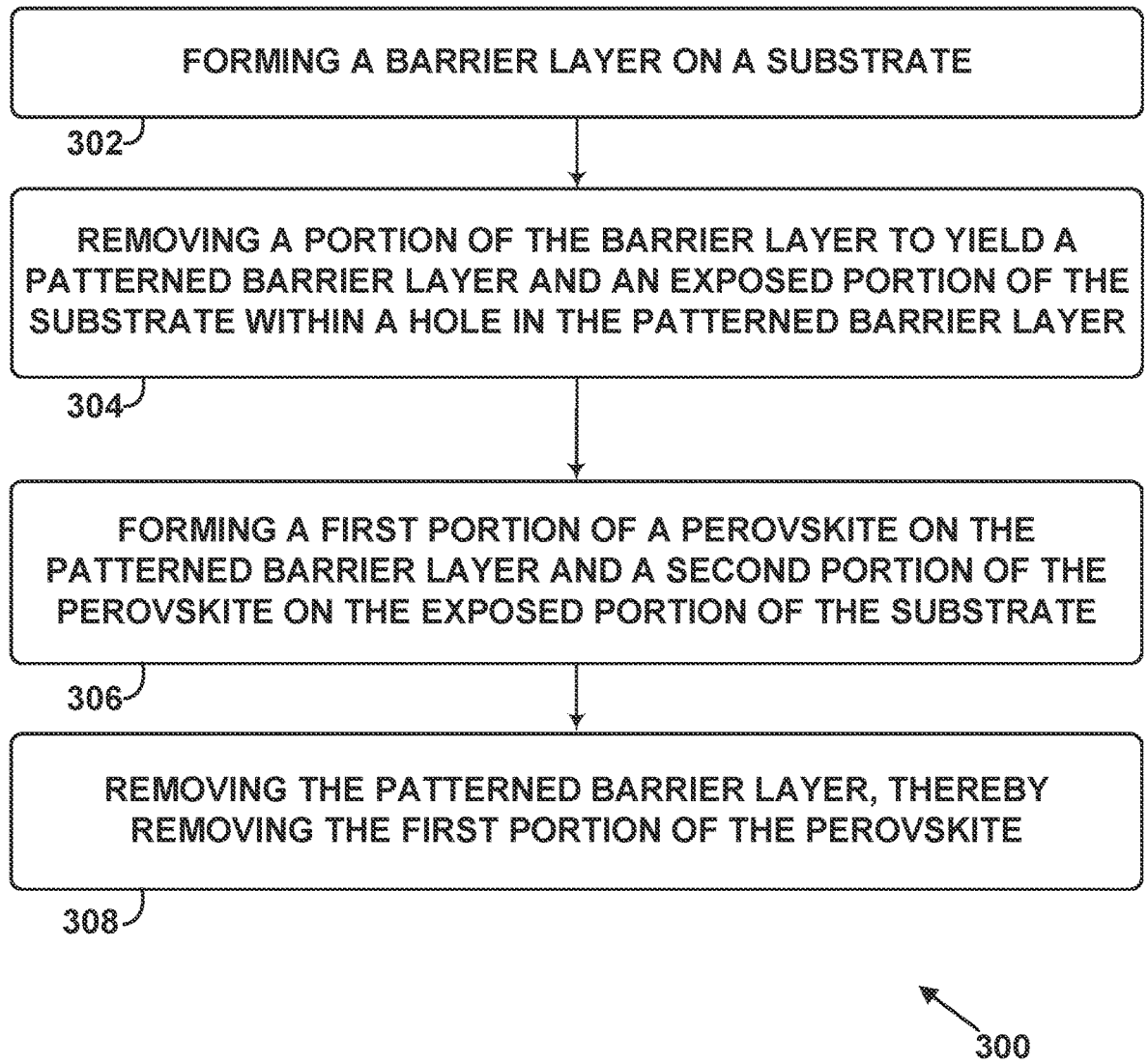
FIG. 12 is a block diagram of a method, according to an example embodiment.

FIG. 12 and FIG. 13 are block diagrams of the method 300 and the method 500. As shown in FIG. 12 and FIG. 13, the method 300 and the method 500 include one or more operations, functions, or actions as illustrated by blocks 302, 304, 306, 308, 502, 504, and 506. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

At block 302, the method 300 includes forming the barrier layer 104 on the substrate 102, as shown in FIG. 3 and FIG. 5.

At block 304, the method 300 includes removing the portion 105 of the barrier layer 104 to yield the patterned barrier layer 104 and the exposed portion 702 of the substrate 102 within the hole 106 in the patterned barrier layer 104, as shown in FIG. 3 and FIG. 6.

At block 306, the method 300 includes forming the first portion 108a of the perovskite 108 on the patterned barrier layer 104 and the second portion 108b of the perovskite 108 on the exposed portion 702 of the substrate 102, as shown in FIG. 3.

At block 308, the method 300 includes removing the patterned barrier layer 104, thereby removing the first portion 108a of the perovskite 108.

At block 502, the method 500 includes forming the electrically insulating layer 120 on the substrate 102 such that the electrically insulating layer 120 forms the aperture 402 that exposes the substrate 102, as shown in FIG. 10.

At block 504, the method 500 includes forming the one or more functional layers 404 on the electrically insulating layer 120 and within the aperture 402 on the substrate 102, as shown in FIG. 10.

At block 506, the method 500 includes forming the electrode layer 124 on the one or more functional layers 404, as shown in FIG. 10.

Examples of the present disclosure can thus relate to one of the enumerated clauses (ECs) listed below.

Clause 1 is a method comprising: forming a barrier layer on a substrate; removing a portion of the barrier layer to yield a patterned barrier layer and an exposed portion of the substrate within a hole in the patterned barrier layer; forming a first portion of a perovskite on the patterned barrier layer and a second portion of the perovskite on the exposed portion of the substrate; and removing the patterned barrier layer, thereby removing the first portion of the perovskite.

Clause 2 is the method of clause 1, wherein the barrier layer comprises poly(p-xylylene).

Clause 3 is the method of any of clauses 1-2, wherein the exposed portion of the substrate includes a first pixel.

Clause 4 is the method of any of clauses 1-3, wherein removing the portion of the barrier layer comprises dissolving or etching the portion of the barrier layer.

Clause 5 is the method of any of clauses 1-4, wherein removing the patterned barrier layer comprises dissolving or etching the patterned barrier layer.

Clause 6 is the method of any of clauses 1-5, wherein forming the barrier layer on the substrate comprises forming one or more of Parylene™ C, Parylene™ D. Parylene™ FIT, Parylene™ AF-4, or Parylene™ F on the substrate Clause 7 is the method of any of clauses 1-6, wherein removing the portion of the barrier layer comprises removing multiple portions of the barrier layer to yield an array of exposed pixels of the substrate within holes in the patterned barrier layer, and wherein forming the second portion of the perovskite comprises forming the second portion of the perovskite on the exposed pixels of the substrate.

Clause 8 is the method of any of clauses 1-7, wherein forming barrier layer on the substrate comprises forming the barrier layer on glass, silicon, polyester (PET), polyimide (PI), polyethylene naphthalate (PEN), polyetherimide (PEI), or sapphire.

Clause 9 is the method of any of clauses 1-8, wherein forming the barrier layer on the substrate comprises forming the barrier layer via chemical vapor deposition (CVD).

Clause 10 is the method of any of clauses 1-9, wherein forming the barrier layer on the substrate comprises forming the barrier layer at an ambient temperature within a range of 18° C. to 23° C.

Clause 11 is the method of any of clauses 1-10, wherein forming the barrier layer on the substrate comprises forming the barrier layer on the substrate to have a thickness within a range of 1 μm to 5 μm.

Clause 12 is the method of any of clauses 1-11, wherein removing the portion of the barrier layer comprises: forming a photoresist layer on the barrier layer; exposing a portion of the photoresist layer not covered by a mask to light; developing the photoresist layer, thereby creating a second hole within the photoresist layer; and etching the barrier layer at a bottom of the second hole, thereby forming the hole in the patterned barrier layer.

Clause 13 is the method of clause 12, wherein etching the barrier layer at the bottom of the second hole comprises performing reactive ion etching (RIE).

Clause 14 is the method of any of clauses 12-13, wherein etching the barrier layer at the bottom of the second hole comprises etching the barrier layer with a solvent.

Clause 15 is the method of any of clauses 1-14, wherein forming the first portion and the second portion of the perovskite comprises forming the first portion and the second portion of the perovskite via spin coating.

Clause 16 is the method of clause 15, wherein forming the first portion and the second portion of the perovskite via spin coating comprises: dispensing a solution of one or more of $C_8H_{12}BrN$ (PEABr), CsBr, or $PbBr_2$ dissolved within dimethyl sulfoxide on the patterned barrier layer and on the exposed portion of the substrate; and spinning the substrate such that the solution is spread across the patterned barrier layer and on the exposed portion of the substrate.

Clause 17 is the method of any of clauses 15-16, wherein forming the first portion and the second portion of the perovskite via spin coating comprises: dispensing a solution of one or more of $C_8H_{12}ClN$ (PEACl), CsCl, $PbCl_2$, $C_8H_{12}IN$ (PEAI), CsI, or $PbI_2$ dissolved within dimethyl sulfoxide on the patterned barrier layer and on the exposed portion of the substrate; and spinning the substrate such that the solution is spread across the patterned barrier layer and on the exposed portion of the substrate.

Clause 18 is the method of any of clauses 1-17, wherein forming the first portion and the second portion of the perovskite comprises forming the first portion and the second portion of the perovskite to include one or more metal halides with a formula $ABX_3$, with A being a monovalent cation including one or more of Cs, methylammonium, or formamidinium, B being a metal including Pb or Sn, and X being a halide including Cl, Br, or I.

Clause 19 is the method of any of clauses 1-18, wherein forming the first portion and the second portion of the perovskite comprises annealing the perovskite.

Clause 20 is the method of any of clauses 1-19, wherein removing the patterned barrier layer comprises clasping the patterned barrier layer and pulling the patterned barrier layer off of the substrate.

Clause 21 is the method of any of clauses 1-20, further comprising: prior to forming the barrier layer on the substrate, forming and patterning an insulating layer on the substrate to yield a patterned insulating layer and the exposed portion of the substrate within a second hole of the patterned insulating layer; and wherein forming the barrier layer on the substrate comprises forming the barrier layer on the patterned insulating layer and within the second hole of the patterned insulating layer, and wherein the hole in the patterned barrier layer is aligned with the second hole of the patterned insulating layer.

Clause 22 is the method of clause 21, wherein forming and patterning the insulating layer on the substrate comprises forming and patterning the insulating layer on an electrode layer of the substrate.

Clause 23 is the method of clause 22, further comprising depositing a second electrode layer on the patterned insulating layer and the second portion of the perovskite.

Clause 24 is the method of any of clauses 1-23, wherein the perovskite is a first perovskite configured to emit first light via photoluminescence, the first light having a first spectral power distribution, the method further comprising: forming an additional barrier layer on the second portion of the first perovskite and on the substrate; removing a portion of the additional barrier layer to yield a second patterned barrier layer and a second exposed portion of the substrate within a second hole in the second patterned barrier layer; forming a first portion of a second perovskite on the second patterned barrier layer and a second portion of the second perovskite on the second exposed portion of the substrate, wherein the second perovskite is configured to emit second light via photoluminescence, the second light having a second spectral power distribution that is substantially different from the first spectral power distribution; and removing the second patterned barrier layer, thereby removing the first portion of the second perovskite.

Clause 25 is the method of clause 24, wherein the second exposed portion of the substrate includes a second pixel.

While various example aspects and example embodiments have been disclosed herein, other aspects and embodiments will be apparent to those skilled in the art. The various example aspects and example embodiments disclosed herein are for purposes of illustration and are not intended to be limiting, with the true scope and spirit being indicated by the following claims.

What is claimed is:

1. A method comprising:
    forming a barrier layer on a substrate;
    removing a portion of the barrier layer to yield a patterned barrier layer and an exposed portion of the substrate within a hole in the patterned barrier layer;
    forming a first portion of a material on the patterned barrier layer and a second portion of the material on the exposed portion of the substrate, wherein the material is a perovskite material configured to absorb light and remit light in a different color; and
    removing the patterned barrier layer, thereby removing the first portion of the material.

2. The method of claim 1, wherein removing the patterned barrier layer comprises dissolving or etching the patterned barrier layer.

3. The method of claim 1, wherein forming the barrier layer on the substrate comprises forming one or more of poly(p-xylylene), Parylene™ C, Parylene™ D, Parylene™ HT, Parylene™ AF-4, or Parylene™ F on the substrate.

4. The method of claim 1,
    wherein removing the portion of the barrier layer comprises removing multiple portions of the barrier layer to yield an array of exposed pixels of the substrate within holes in the patterned barrier layer, and
    wherein forming the second portion of the material comprises forming the second portion of the material on the exposed pixels of the substrate.

5. The method of claim 1, wherein forming barrier layer on the substrate comprises forming the barrier layer on glass, silicon, polyester (PET), polyimide (PI), polyethylene naphthalate (PEN), polyetherimide (PEI), or sapphire.

6. The method of claim 1, wherein forming the barrier layer on the substrate comprises forming the barrier layer via chemical vapor deposition (CVD).

7. The method of claim 1, wherein forming the barrier layer on the substrate comprises forming the barrier layer at an ambient temperature within a range of 18° C. to 23° C.

8. The method of claim 1, wherein removing the portion of the barrier layer comprises:
    forming a photoresist layer on the barrier layer;
    exposing a portion of the photoresist layer not covered by a mask to light;
    developing the photoresist layer, thereby creating a second hole within the photoresist layer; and
    etching the barrier layer at a bottom of the second hole, thereby forming the hole in the patterned barrier layer.

9. The method of claim 8, wherein etching the barrier layer at the bottom of the second hole comprises performing reactive ion etching (RIE).

10. The method of claim 8, wherein etching the barrier layer at the bottom of the second hole comprises etching the barrier layer with a solvent.

11. The method of claim 1, wherein forming the first portion and the second portion of the material comprises forming the first portion and the second portion of the material via spin coating or inkjet printing.

12. The method of claim 11, wherein forming the first portion and the second portion of the material via spin coating comprises:
    dispensing a solution of one or more of $C_8H_{12}BrN$ (PEABr), CsBr, $PbBr_2$, $C_8H_{12}ClN$ (PEACl), CsCl, $PbCl_2$, $C_8H_{12}IN$ (PEAI), CsI, or $PbI_2$ dissolved within dimethyl sulfoxide on the patterned barrier layer and on the exposed portion of the substrate; and
    spinning the substrate such that the solution is spread across the patterned barrier layer and on the exposed portion of the substrate.

13. The method of claim 1, wherein removing the patterned barrier layer comprises clasping the patterned barrier layer and pulling the patterned barrier layer off of the substrate.

14. The method of claim 1, further comprising:
    prior to forming the barrier layer on the substrate, forming and patterning an insulating layer on the substrate to yield a patterned insulating layer and the exposed portion of the substrate within a second hole of the patterned insulating layer; and
    wherein forming the barrier layer on the substrate comprises forming the barrier layer on the patterned insulating layer and within the second hole of the patterned insulating layer, and
    wherein the hole in the patterned barrier layer is aligned with the second hole of the patterned insulating layer.

15. The method of claim 14, wherein forming and patterning the insulating layer on the substrate comprises forming and patterning the insulating layer on an electrode layer of the substrate.

16. The method of claim 15, further comprising depositing a second electrode layer on the patterned insulating layer and the second portion of the material.

17. The method of claim 1, wherein the material is a first material configured to emit first light via photoluminescence or electroluminescence, the first light having a first spectral power distribution, the method further comprising:
    forming an additional barrier layer on the second portion of the first material and on the substrate;
    removing a portion of the additional barrier layer to yield a second patterned barrier layer and a second exposed portion of the substrate within a second hole in the second patterned barrier layer;
    forming a first portion of a second material on the second patterned barrier layer and a second portion of the second material on the second exposed portion of the substrate, wherein the second material is configured to emit second light via photoluminescence or electroluminescence, the second light having a second spectral power distribution that is substantially different from the first spectral power distribution; and
    removing the second patterned barrier layer, thereby removing the first portion of the second material.

18. The method of claim 1, wherein the material is configured to absorb blue light and responsively emit greed light or red light.

19. The method of claim 1, wherein the material is configured to absorb light having a wavelength shorter than blue light and responsively emit blue light, greed light, or red light.

* * * * *